Aug. 16, 1960 J. G. NORDAHL ET AL 2,949,543

ELECTRONIC AMPLIFIER

Filed July 22, 1957 3 Sheets-Sheet 1

INVENTORS
JOHN G. NORDAHL
WILLIAM D. WINTER
Morton C. Jacobs
ATTORNEY

INVENTORS
JOHN G. NORDAHL
WILLIAM D. WINTER
Morton B. Jacobs
ATTORNEY

*INVENTORS*
JOHN G. NORDAHL
WILLIAM D. WINTER
Milton C. Jacobs
*ATTORNEY*

2,949,543
Patented Aug. 16, 1960

2,949,543

ELECTRONIC AMPLIFIER

John G. Nordahl, Elkins Park, and William D. Winter, Newton Square, Pa., assignors to Sperry Rand Corporation, New York, N.Y., a corporation of Delaware Filed July 22, 1957, Ser. No. 673,224

15 Claims. (Cl. 307—88.5)

This invention relates to electronic amplifiers using semiconductors.

It is among the objects of this invention to provide:

A new and improved electronic amplifier using semiconductors;

A new and improved transistor amplifier having high gain;

A new and improved transistor pulse amplifier that is fast in operation.

In accordance with this invention, the collector-emitter paths of a first transistor is connected in series with the base-emitter path of a second transistor. Input signals are applied to the base of the first transistor, and output signals are derived from the collector-emitter paths of the two transistors connected together.

For pulse amplification, the first transistor is driven into saturation and the voltage drop across the emitter-collector path of the first transistor helps prevent the second transistor from saturating. Turnoff of the second transistor is accelerated by the application of reverse bias to the base-emitter path of the second transistor at the proper time.

The foregoing and other objects, the advantages and novel features of this invention, as well as the invention itself both as to its organization and mode of operation, may be best understood from the following description when read in connection with the accompanying drawing, in which like reference numerals refer to like parts, and in which.

Figure 1:
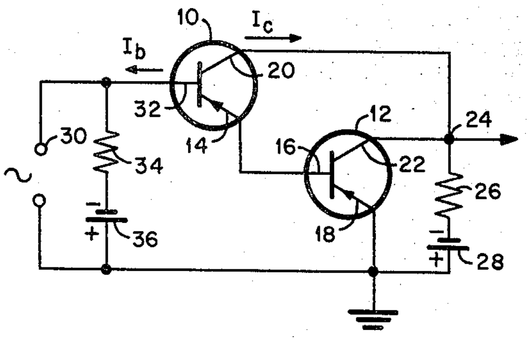
Fig. 1 is a schematic circuit diagram of a transistor amplifier embodying this invention.

In Fig. 1, a transistor amplifier circuit embodying this invention includes a first transistor 10 and a second transistor 12. These transistors may be of the junction, p-n-p type. The emitter 14 of the first transistor 10 is connected to the base 16 of the second transistor 12. The second transistor 12 is connected as a common emitter circuit with its emitter connected to a common return path shown by the conventional ground symbol. The collectors 20 and 22 of the respective transistors 10 and 12 are both connected to an output terminal 24, which terminal 24 is connected through a load resistor 26 to the negative terminal of a direct voltage source 28. The positive terminal of the source 28 is returned to ground. A terminal 30 connected to the base 32 of the first transistor 10 receives input signals. The base 32 may be biased by way of a resistor 34 and a direct voltage source 36. The source 36 biases the emitter-base path of the transistors 10 and 12 in the forward direction, for example, for class A operation.

Figure 2:
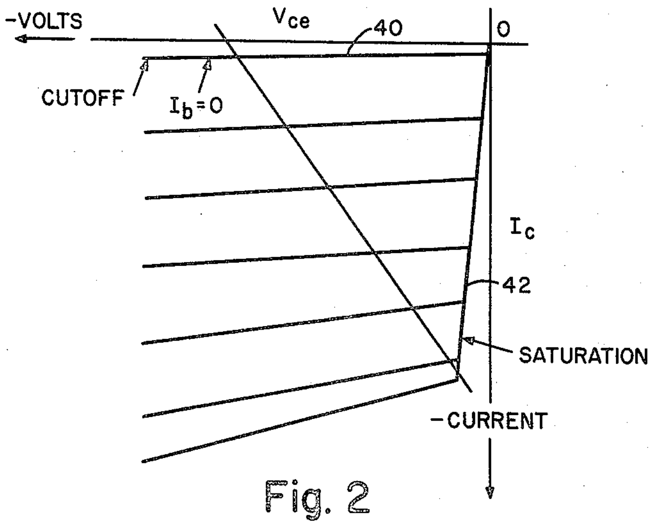
Fig. 2 is an idealzed graph of the collector characteristics of transistors that may be used in the circuit of Fig. 1.

The amplifier circuit of Fig. 1 may be operated in the linear region of the transistor characteristic. An idealized graph of suitable collector characteristics is shown in Fig. 2. A linear, or active, region of operation of the circuit of Fig. 1 lies generally between the cutoff region 40 and the saturation region 42. The cutoff region 40 is characterized by zero (or reverse) base current. The saturation region 42 is characterized by maximum collector current for the particular circuit parameters. It may be assumed that the transistors follow the load line 41 when operating in the linear region with a suitable resistive load.

In operation, the emitter current of the first transistor 10 (which current is made up of the emitter-base current plus the emitter-collector current) is supplied to the base 16 of the second transistor 12. The emitter current of the first transistor 10 flows in the emitter-base path of the second transistor 12. The emitter current of each transistor generally varies in the same direction with the respective base current. Therefore, the emitter current of the second transistor also varies in the same direction with the input signal.

The collector current of the first transistor is proportional to the product of the current-gain factor of that transistor and the base current, that is, to $B_1I_b$, where $B_1$ is the beta current gain of the first transistor. The base current of the second transistor 12 (which is the sum of the base and collector currents of the first transistor 10) is proportional to $B_1I_b+I_b$. The collector current of the second transistor 12, therefore, is $B_1B_2I_b+B_2I_b$, where $B_2$ is the common-emitter, or beta, current-gain factor of the second transistor 12. Thus, the sum of the currents through both collectors 20 and 22 supplied to the output terminal 24 and the load resistor 26 is $B_1I_b+B_1B_2I_b+B_2I_b$. Accordingly, during operation of this circuit in the linear region, the combined collector current gain is generally the sum of the individual gains of these transistors 10 and 12 plus the product of the individual gains.

Figure 3:
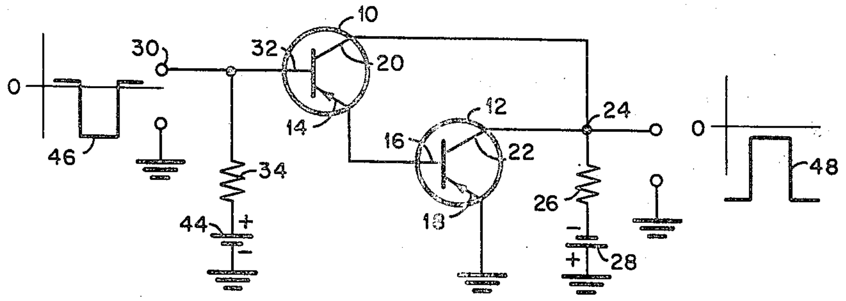
Fig. 3 is a schematic circuit diagram of a transistor pulse amplifier embodying this invention.

In Fig. 3 the transistor circuit of Fig. 1 is shown with a different base bias and is intended for use as a pulse amplifier; parts similar to those previously described are referenced by the same numerals. A direct voltage source 44 connected to the base 32 via the resistor 34 tends to bias the base-emitter path of the first transistor 10 in the reverse direction. Thus in the quiescent condition, both transistors 10 and 12 have substantially zero base current (represented by the line 40 of the graph of Fig. 2), and both transistors are cutoff. A negative-going pulse 46 at the input terminal 30 draws base-emitter current in the forward direction through the transistor 10 and similarly through the transistor 12. Consequently, both transistors 10 and 12 immediately start to conduct; the amplified emitter of the first transistor 10 tends to produce a fast response in the second transistor 12. The amplitude of the input pulse 46 may be such that the first transistor 10 is driven into saturation (graph 42 of Fig. 2).

Upon termination of the input pulse 46 the base 32 is again biased in a reversed direction, which reverse bias terminates emitter-base current and cuts off both transistors 10 and 12. An output voltage pulse 48 at the output terminal 24 is positive-going. Thus the circuit operates to invert the input signal. Upon termination of the input pulse 46 the circuit is restored to the quiescent condition.

Notwithstanding saturation of the first transistor 10 and the gain of that transistor 10, the second transistor 12 does not saturate no matter how hard the base 16 may be driven by emitter current from the first transistor 10. The second transistor 12 remains out of saturation, because there is a small emitter-to-collector voltage drop (of the order of a fraction of a volt) in the first transistor 10 due to collector-emitter current and the very small resistance of the collector-emitter path in saturation. This small voltage drop makes the emitter 14 slightly positive with respect to the collector 20 and, thereby, makes the base 16 of the second transistor 12 slightly positive with respect to its collector 22. Thus, the collector-base junction of the second transistor 12 remains biased in the reversed direction, which condition is necessary and sufficient to insure that the second transistor 12 remains out of saturation. Thus, when the second transistor is rendered conductive in the manner just described, it operates in a region close to the saturation region 42 (Fig. 2) of the transfer characteristic (where the collector voltage is relatively small), but, nevertheless, the transistor 12 operates out of saturation.

Due to the small collector voltage with the transistor near saturation, there is relatively small collector power dissipation notwithstanding a very large collector current. Consequently, the second transistor 12 may be operated at a high current level both efficiently and safely. The operation of the second transistor 12 just out of saturation provides two distinct voltage levels at the output terminal 24; namely, (1) substantially the voltage of the source 28 (corresponding to both transistors 10 and 12 being at cutoff) and (2) (corresponding to both transistors being at full conduction) substantially the difference between the potential of the emitter 18 and the voltage drop from the emitter 18 to the collector 22 (which voltage drop may conceivably be a large percentage of the total collector voltage swing). Thus, this circuit is suitable for use in different applications involving pulse signals, and particularly in applications, such as in digital information handling systems, requiring two rather precise signal levels.

The operation of the signal transistor 12 in an out-of-saturation condition affects favorably the speed of response of the pulse amplifier circuit of Fig. 3. The "turn-off" time of a transistor from the saturation state to the cutoff state consists of, first, the minority carrier storage time for a change from the saturation region 42 (Fig. 2) into the linear region upon termination of the drive current and, second, the decay time for returning the transistor to the cutoff state from operation in the linear region. Thus, with the second transistor 12 operating just out of saturation, there is no turn-off time delay due to minority carrier storage in that transistor 12. There is only the decay time to cutoff. The turn-off of the first transistor 10 from saturation to the linear region and then to cutoff is accelerated by the trailing edge of the input pulse 46. At this trailing edge, the bias voltage 44 is effective to produce a reverse base-emitter current, which sweeps out stored minority carriers and tends to accelerate the decay of the transistor 10 to the cutoff region 40 (Fig. 2). Consequently, the pulse amplifier circuit of Fig. 3 may be used to provide a very high gain without the excessive turn-off time delays generally associated with such high gain.

The advantages of high gain and fast response of the pulse amplifier circuit of Fig. 3 may be furthered by using different types of transistors for the two transistors 10 and 12. The second transistor 12 may be a high current level transistor (that is, a transistor that can safely dissipate a relatively high amount of power) and, the first transistor 10 may be a low current level transistor (relatively low power dissipating). It has been found that certain low current level transistors generally are associated with a high alpha cutoff frequency, and generally have a relatively small minority carrier storage time. The large minority carrier storage time generally associated with certain high current level transistors does not affect adversely the operation of this circuit, because, the second transistor 12 is operated out of saturation. Thus, the operation of the second transistor 12 at a higher current level than the first transistor 10 (which higher current is a result of the cascaded mode of operation) does not add minority carrier storage time to the circuit delay times.

Figure 4:
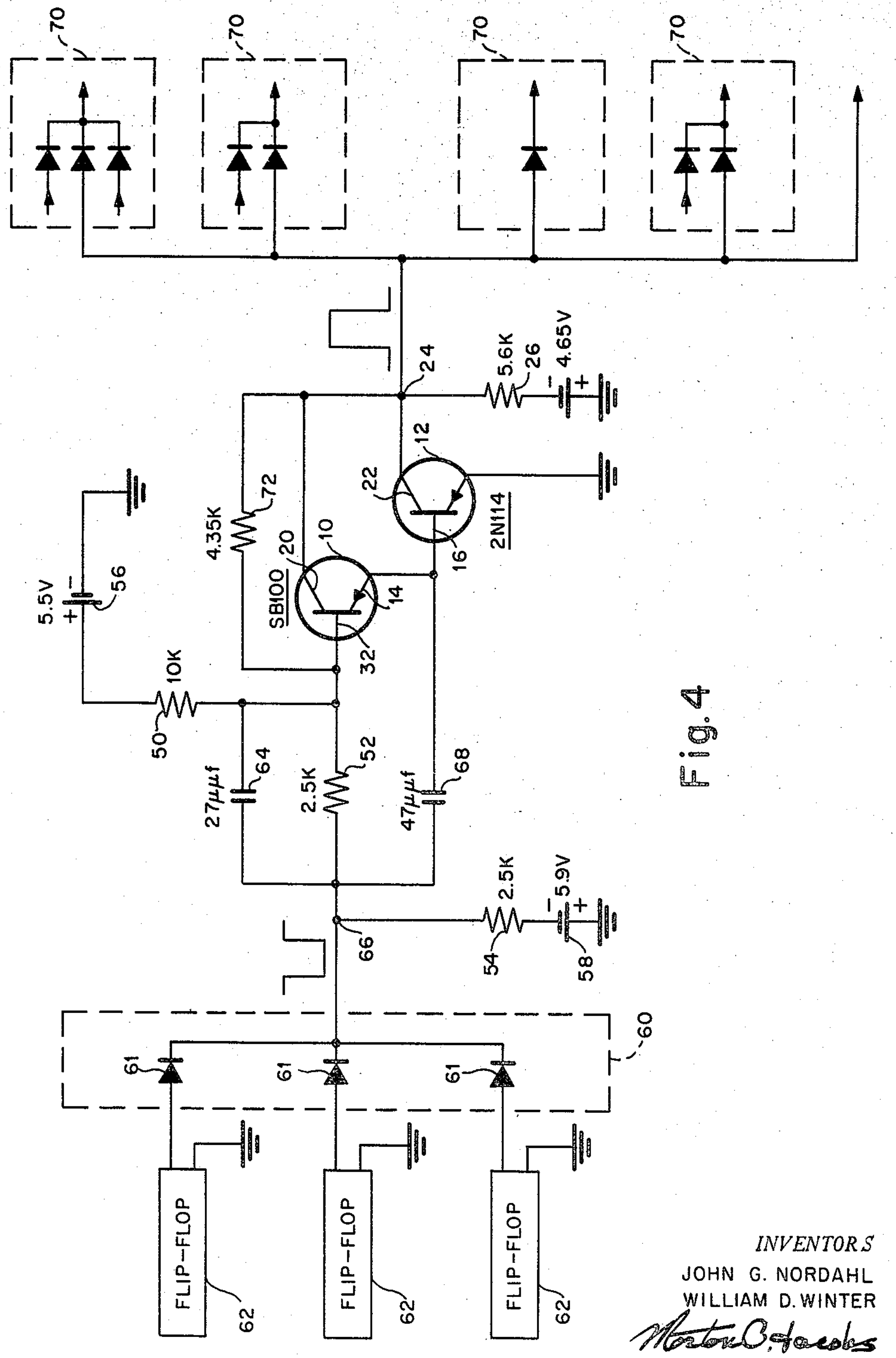
Fig. 4 is a schematic circuit diagram of another transistor pulse amplifier embodying this invention and incorporating a "turnoff" circuit.

In Fig. 4, a pulse amplifier circuit similar to that described above is shown in an application involving binary digital circuits. Parts corresponding to those previously described are referenced by the same numerals. The base-emitter circuit of the first transistor 10 tends to be biased in the forward direction by means of the series combination of resistors 50, 52, 54 and the direct voltage sources 56 and 58 in the absence of input current to the terminal 66. A diode logic circuit 60, such as an "and" gate or a buffer, supplies input current to the terminal 66 to produce a reverse bias of the base-emitter path of the first transistor 10. The diodes 61 of the logic circuit 60 are respectively driven by individual binary digital elements (one form of which may be, for example, the flip-flops 62) in a suitable fashion. The binary signals supplied by the flip-flops 62 either cause the associated diodes 61 to conduct in the forward direction or bias the diodes 61 in the back direction. A capacitor 64 is connected across resistor 52 to produce a differentiating action of any step of voltage appearing at the terminal 66. Another capacitor 68 is connected between the terminal 66 and the base 16 of the second transistor 12. The resistor 26 serves as a discharge path for stray capacitances and as a nominal load. The output terminal 24 of the pulse amplifier is connected to the diodes of a number of logic circuits 70. This pulse amplifier may be used to drive a large number of these logic circuits 70, only a few of which are shown by way of illustration. The logic circuits 70, in turn, may be connected to other binary circuits, such as other logic circuits (not shown). A set of suitable circuit parameters and transistor types are indicated in Fig. 4 to illustrate an operative embodiment of this invention.

In operation, the combination of initial conditions of the flip-flops 62 may be such as to produce (for the illustrated circuit parameters) one or more signals in the most positive state, at about ground potential, at the anodes of any of the diodes 61. These diodes 61 conduct to produce a reverse bias on the base 32 of the first transistor 10. This reverse bias maintains both transistors 10 and 12 in the cutoff condition. An abrupt drop of voltage from all the flip-flops 62 whose outputs have been in the most positive state of a few volts results in a similarly abrupt negative-going step of voltage at the terminal 66. This negative-going voltage step is differentiated by the capacitor 64 and applied to the base 32 to draw emitter-base current in the forward direction. Both transistor 10 and 12 start to conduct, and the first transistor 10 quickly saturates as the voltage at the collector 20 rises to a voltage slightly negative with respect to its emitter 14. The second transistor 12 conducts heavily but is held just out of saturation in a manner similar to that described above. The direct current coupling via the resistor 52 which allows sustained current to flow between the terminal 66 and the base 32 maintains the amplifier in the conducting condition as long as terminal 66 is held in the most negative state. The corresponding positive-going step appearing at the output terminal 24 drives the diodes of the diode logic circuit 70 connected to that terminal 24.

When the flip-flops 62 reverse their conditions to apply a positive-going voltage step to the anodes of the diodes 61, the resulting positive-going step of voltage at the terminal 66 is differentiated by the capacitor 64 and applied to the base 32 to drive the transistor 10 in the reverse direction. Reverse current forced into the base 32 in this manner quickly "cleans up" the minority carriers of the heavily saturated first transistor 10. Thus this transistor 10 is rapidly driven out of saturation and to cutoff as its junction currents fall to zero.

Turn-off of the second transistor 12 is accelerated by means of the coupling capacitor 68 connected from the terminal 66 to the base 16. The positive-going step at the terminal 66 is transmitted by the capacitor 68 to apply reverse current to the base-emitter path of the second transistor 12. This reverse drive reduces the decay time of the second transistor 12 in the linear operating region and, thereby, accelerates the turn-off of that transistor 12. This turn-off acceleration of the second transistor substantially improves the overall turn-off characteristics of the amplifier circuit.

A feedback resistor 72 may be connected from the collectors 20, 22 to the base 32. This feedback resistor 72 may be used to reduce the overall gain of the amplifier circuit to a desired level and to stabilize this overall gain against variations in the gain of the individual transistors and in other circuit parameters. The feedback resistor 72 may also be used to improve the overall response time of the circuit. Minority carrier storage time delays are generally a function of the current gain of a transistor. By means of the feedback resistor 72 the minority carrier storage time of the first transistor 10 may be substantially reduced as the overall gain is reduced. For example, it has been found that a substantial reduction in the overall gain by such a linear feedback resistor to a resultant gain of a single transistor with identical characteristics to those in this circuit results in a decrease in time delay (due to minority carrier storage) to a value that is the order of one-half of the usual such time delay of that single transistor operating at the same current level without feedback.

Figure 5:
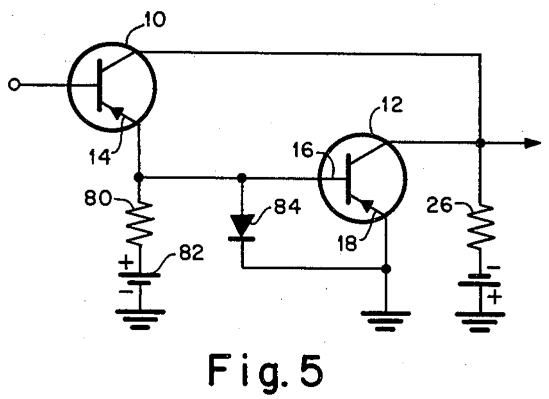
Fig. 5 is a schematic circuit diagram of a transistor pulse amplifier incorporating another "turnoff" circuit.

In Fig. 5, a modification of the circuit of Fig. 4 is shown in which a different turn-off circuit for the second transistor 12 is used. Parts corresponding to those previously described are referenced by the same numerals. Connected to the emitter 14 is one terminal of a resistor 80 the other terminal of which is connected to the positive terminal of a direct voltage source 82. A diode 84 is connected between the base 16 and the emitter 18 of the second transistor 12. This diode 84 is poled to clamp the base 16 at ground potential.

In operation, when the first transistor 10 is driven to cutoff, a current is supplied by the source 82 and the resistor 80 to bias off the second transistor 12 in a reverse direction. This reverse bias drive accelerates the turn-off decay of the second transistor 12. When this second transistor 12 is cutoff, the diode 84 conducts to feed the current from the source 82 and resistor 80 to ground. Thereby, the diode 84 prevents the current through resistor 80 from turning on the first transistor 10. The value of this current is, of course, determined by the values of the resistor 80 and the voltage from the source 82, and this current is chosen from the standpoints of its effects during turn-on, full conduction, and turn-off of the transistors. A larger current is provided where high turn-off speed is more important, and a smaller current where high turn-on speed is more important. An optimum current value may be chosen where turn-on and turn-off times are to be the same.

Other "turn-off" circuits for accelerating the cutoff of the second transistor of a pulse amplifier embodying this invention may be used.

Figure 6:
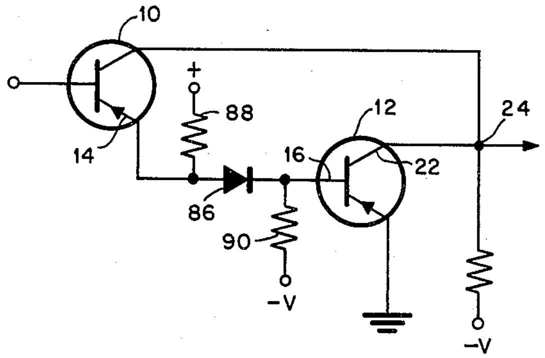
Fig. 6 is a schematic circuit diagram of a transistor pulse amplifier having another means for controlling the base-collector voltage of the second transistor.

In Fig. 6, a pulse amplifier circuit of the type described above is shown modified by a bias circuit connected between the emitter 14 and the base 16. This bias circuit includes a diode 86 connected in the reverse direction of normal current flow between the emitter 14 and the base 16. Current flow in the forward direction is supplied from the positive terminal of a voltage source through a resistor 88 to the anode of the diode 86, and from its cathode via a resistor 90 to the negative terminal of a direct voltage source.

The magnitudes of the resistors 88 and 90 and of the direct voltages applied thereto are chosen to be such that a quiescent current flow is produced in the forward direction through the diode 86 that is substantially greater than the emitter current of the first transistor 10 when it is operating in saturation. In the cutoff condition of the transistors 10 and 12, the voltage levels involved and the bias current flowing through the diode 86 is such as to leave that cutoff substantially unaffected with zero base current in each transistor.

When the first transistor 10 is driven to conduction, the circuit of the diode 86 has substantially no effect on the normal operation of the transistors 10 and 12 in that emitter current of the first transistor 10 merely serves to reduce the forward current flow through the diode 86 without any substantial change in the voltage drop across that diode 86. Thus, emitter current of the first transistor 10 is drawn by way of the resistor 88, and a corresponding base current of the second transistor 12 flows through the resistor 90 resulting in a reduction of the forward current of the diode 86. The voltage drop produced by forward current through the diode 86 is very small and remains substantially constant for the range of emitter currents involved. This small voltage drop across the diode 86 opposes the emitter-to-collector voltage drop in the first transistor 10. Consequently, this diode voltage drop tends to reduce the reverse bias voltage between the base 16 and collector 22 of the second transistor 12, and to permit the second transistor to operate closer to saturation. Thus, the circuit of the diode 86 permits control of the magnitude of the reverse base-collector voltage of the transistor 12, and, thereby, a control of the operating point near to saturation at which the second transistor 12 may operate.

A similar diode circuit (not shown) may be connected in the collector circuit of the first transistor 10, instead of in the emitter circuit, to produce a similar effect. A similar diode circuit (not shown) connected in the collector circuit of the second transistor 12 tends to increase the base-to-collector reverse bias in that transistor 12.

Figure 7:
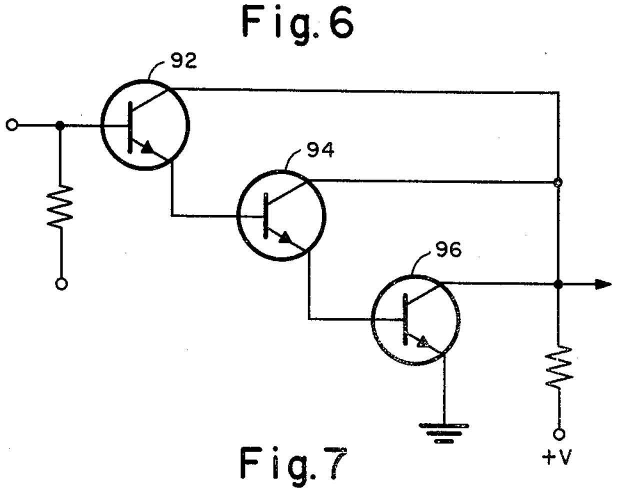
Fig. 7 is a schematic circuit diagram of a transistor amplifier embodying this invention having three transistor stages.

In Fig. 7, a three-stage amplifier circuit embodying this invention is shown. Three transistors 92, 94, 96 of the n-p-n type are employed. The emitter of the first 92 is connected to the base of the second 94, and the emitter of the second is connected to the base of the third 96.

The three collectors are connected together to supply output current to a common load circuit. The biasing is suitable for n-p-n transistors and analagous to that described above for p-n-p transistors.

In operation, the circuit of Fig. 7 is similar to those described above except for differences in current directions due to the n-p-n type of transistors that are used. The combined gain of the first and second transistors 92, 94 is generally the same as that of the two-transistor circuits. The additional gain due to the cascading of the third transistor 96 is the gain of that transistor 96 plus the product of that third transistor gain and the combined gain of the first and second transistors 92 and 94.

In operation as a pulse amplifier, the first transistor 92 may be driven into saturation and the second and third transistors 94 and 96 operated just out of saturation in a manner similar to that described above with respect to the second transistor 12 in the circuits of Figs. 3 or 6. A bias circuit similar to that of Fig. 6 may be used to control the magnitude of the back collector-base voltage of the transistors 94 and 96 at full conduction. Turn-off circuits for the second and third transistors 94 and 96 may be provided in a manner similar to that described above with respect to the second transistor 12 in the circuits of Figs. 4 and 5.

Accordingly, by means of this invention a new and improved transistor amplifier is provided. This amplifier has high gain. This amplifier may be used for pulse signals and has a fast response characteristic.

What is claimed is:

1. An amplifier comprising a plurality of semiconductive devices each having base, emitter, and collector electrodes, means connecting each of the base-emitter and the collector-emitter paths of a first one of said devices in series with the base-emitter path of a second one of said devices, pulse means coupled to said base electrode of said first device for applying thereto input signals of magnitude sufficient to drive said first device into saturation, an output terminal, and means connecting the collector emitter paths of said devices in parallel circuits and to said output terminal, said connecting means being such that the potential difference from said second device collector electrode to said second device base electrode produced via said first device collector-emitter path during saturation of said first device tends to prevent forward conduction in the collector-base path of said second device, and a feedback means connected from said output terminal to said first device base electrode to reduce the overall gain of said devices.

2. An amplifier comprising a plurality of semiconductive devices each having base, emitter, and collector electrodes, means connecting said emitter electrode of a first one of said devices to said base electrode of said second device whereby base-emitter and collector-emitter currents of said first device flow in the base-emitter path of said second device, means for supplying input signals to said first device base electrode, means for connecting a common return path to said second device emitter electrode, output means for receiving currents flowing in the collector-emitter paths of said first and second devices, and a feedback impedance connected degeneratively from said output means to said first device base electrode to reduce the overall gain of said first and second devices to the order of the gain of one of said devices.

3. In a binary signal system in which a first binary means supplies binary input signals and in which a second binary means operates in response to binary output signals, the combination with said first and second binary means of an amplifier, said amplifier comprising a plurality of semiconductive devices each having base, emitter, and collector electrodes, means connecting said emitter electrode of a first one of said devices to said base electrode of said second device so that base-emitter and collector-emitter currents of said first device flow in the base-emitter path of said second device, bias means connected to said first device base electrode means for connecting said first binary means to supply input signals to said first device base electrode, an output impedance having a first and a second terminal, means connecting said first terminal to the collector electrodes of said first and second devices for receiving currents flowing in the collector-emitter paths thereof and for supplying said binary output signals to said second binary means, means for supplying an operating potential to said second terminal, means connecting a common return path to said second device emitter electrode, to said first binary means, and to said operating potential supplying means, the bias of said bias means and one of said binary input signals supplied by said first means being of such direction and of magnitude sufficient to combine to drive said first device to saturation, at least one of said output impedance and connecting means including voltage dropping means and being such that the potential difference from said second device collector electrode to said second device base electrode produced via said first device emitter-collector path during saturation tends to prevent forward conduction in the collector-base path of said second device and thereby to prevent said second device from saturating, said bias and the other of said binary signals supplied by said first binary means being such as to place said first device in a cutoff condition, and means for supplying current in the reverse direction to said second device base-emitter path to cutoff said second device when said other binary signal is supplied to place said first device in a cutoff condition, said current supplying means including a resistor having a terminal connected to said second device base electrode, and means for supplying a potential to another terminal of said resistor in a direction to bias said base-emitter path of said second device in the reverse direction.

4. The combination as recited in claim 3, wherein said first binary means includes a binary signal mixing circuit, and said second binary means includes a plurality of binary signal mixing circuits each connected to receive said output signals.

5. A binary signal amplifier system comprising a plurality of semiconductive devices each having base, emitter, and collector electrodes, means connecting said emitter electrode of a first one of said devices to said base electrode of said second device so that base-emitter and collector-emitter currents of said first device flow in the base-emitter path of said second device, bias means connected to said first device base electrode, means for supplying input signals to said first device base electrode, an output impedance having a first and a second terminal, means connecting said first terminal to the collector electrodes of said first and second devices for receiving currents flowing in the collector-emitter paths thereof, and means for connecting a common return path to said second device emitter electrode, to said second terminal of said output impedance, to said bias means, and to said signal supplying means, said means for supplying input signals including a binary-operated means for supplying binary signals to said first device base electrode, the bias of said bias means and one of said binary signals being of such direction and magnitude as to combine to saturate said first device, at least one of said impedances and said connecting means including voltage dropping means and being such that the potential difference from said second device collector electrode to said second device base electrode produced via said first device emitter-collector path during saturation tends to prevent forward conduction in the collector-base path of said second device and thereby to prevent said second device from saturating, said bias and the other of said binary signals being of such direction and magnitude as to place said first device in a cutoff condition, and means for supplying current in the reverse direction to said second device base-emitter path to cut off said second device when said other binary signal is supplied to place said first device in a cutoff condition.

6. In a binary signal system in which a first binary means supplies binary input signals and in which a second binary means operates in response to binary output signals, the combination with said first and second binary means of an amplifier, said amplifier comprising a plurality of transistors each having base, emitter, and collector electrodes, means connecting said emitter electrode of a first one of said transistors to said base electrode of said second transistor so that base-emitter and collector-emitter currents of said first transistor flow in the base-emitter path of said second transistor, means for connecting said first binary means to supply input signals to said first transistor base electrode, an output impedance having a first and a second terminal, means connecting said first terminal to the collector electrodes of said first and second transistors for receiving currents flowing in the collector-emitter paths thereof and for supplying said binary output signals to said second binary means, means connecting a common return path to said second transistor emitter electrode, to said first binary means, and to said second terminal of said output impedance, and reverse bias means connected to said first transistor base electrode and to said common return path for biasing said transistors to cutoff condition, one of said binary input signals supplied by said first means being a current of such direction and of magnitude sufficient to overcome the bias of said means and to drive said first transistor to saturation, said output means impedance and connecting means being such that the potential difference from said second transistor collector electrode to said second transistor base electrode produce via said first transistor emitter-collector path during saturation tends to prevent forward conduction in the collector-base path of said second transistor and thereby to prevent said second transistor from saturating, the other of said binary signals supplied by said first binary means being such as to permit said reverse bias means to place said first transistor in a cutoff condition, and means for supplying current in the reverse direction to said second device base-emitter path to cut off said second device when said other binary signal is supplied to place said first device in a cutoff condition.

7. In a binary signal system in which a first binary means supplies binary input signals and in which a second binary means operates in response to binary output signals, the combination with said first and second binary means of an amplifier, said amplifier comprising a plurality of semiconductive devices each having base, emitter, and collector electrodes, means connecting said emitter electrode of a first one of said devices to said base electrode of said second device so that base-emitter and collector-emitter currents of said first device flow in the base-emitter path of said second device, bias means connected to said first device base electrode, means for connecting said first binary means to supply input signals to said first device base electrode, an output impedance having a first and a second terminal, means connecting said first terminal to said collector electrodes for receiving currents flowing in the collector-emitter paths of said first and second devices and for supplying said binary output signals to said second binary means, means for supplying an operating potential to said second terminal, means connecting a common return path to said second device emitter electrode, to said first binary means, and to said operating potential supplying means, the bias of said bias means and one of said binary input signals supplied by said first means being of such direction and of magnitude sufficient to combine to saturate said first device, at least one of said output impedance and connecting means including voltage dropping means and being such that the potential difference from said second device collector electrode to said second device base electrode produced via said first device emitter-collector path during saturation tends to prevent forward conduction in the collector-base path of said second device and thereby to prevent said second device from saturating, said bias and the other of said binary signals supplied by said first binary means being such as to place said first device in a cutoff condition, means for supplying current in the reverse direction to said second device base-emitter path to cutoff said second device when said other binary signal is supplied to place said first device in a cutoff condition, said current supplying means including an impedance element having a terminal connected to said second device base electrode, and means for connecting another terminal of said impedance element to said common return path, and a diode connected across said base-emitter path of said second device and poled to clamp the potential of said second device base-electrode to the potential of said second device emitter electrode.

8. A binary signal amplifier system comprising a plurality of semiconductive devices each having base, emitter, and collector electrodes, means connecting said emitter electrode of a first one of said devices to said base electrode of said second device so that base-emitter and collector-emitter currents of said first device flow in the base-emitter path of said second device, reverse bias means connected to said first device base electrode for cutting off said first device, means for supplying input signals to said first device base electrode, an output impedance having a first and a second terminal, means connecting said first terminal to the collector electrodes of said first and second devices for receiving currents flowing in the collector-emitter paths thereof, and means for connecting a common return path to said second device emitter electrode, to said second terminal of said output impedance, to said bias means, and to said signal supplying means, said means for supplying input signals including a binary-operated means for supplying binary signals to said first device base electrode, the bias of said bias means and one of said binary signals being of such direction and magnitude as to combine to saturate said first device, at least one of said impedance and said connecting means including voltage dropping means and being such that the potential difference from said second device collector electrode to said second device base electrode produced via said first device emitter-collector path during saturation tends to prevent forward conduction in the collector-base path of said second device and thereby to prevent said second device from saturating, said bias and the other of said binary signals being of such direction and magnitude as to place said first device in a cutoff condition.

9. A binary signal amplifier system as recited in claim 5 wherein said means for supplying current in a reverse direction to said second device base-emitter path includes a capacitor coupling between said means for supplying input signals and said second device base electrode.

10. A binary signal amplifier system as recited in claim 5 wherein said means for supplying current in a reverse direction to said second device base-emitter path includes a source of current having a substantial impedance and connected to said second device base electrode and effective to supply current in in the reverse direction thereto when said first device is cut off.

11. A binary signal amplifier system as recited in claim 5 wherein said binary-operated input signal means supplies binary signals in the form of pulses and the absence of pulses.

12. A binary signal amplifier system as recited in claim 5 wherein said binary-operated input signal means supplies binary signals in the form of two different potential levels.

13. A binary signal amplifier system as recited in claim 5 wherein said connecting means between said second device collector electrode and base electrode via said first device emitter-collector path includes a normally conducting diode to provide a predetermined potential drop.

14. A binary signal amplifier system as recited in claim 5 wherein said means connecting said first device emitter electrode to said second device base electrode includes a diode in series with the connected electrodes and poled oppositely from the direction of forward current in said first device collector-emitter path, and means for biasing said diode for forward conduction.

15. A binary signal amplifier system as recited in claim 5 wherein said means connecting said first terminal of said output impedance to said collector electrodes and said means connecting said first device emitter electrode to said second device base electrode provide direct connections.

References Cited in the file of this patent

UNITED STATES PATENTS

| | | |
|---|---|---|
| 2,533,001 | Eberhard | Dec. 5, 1950 |
| 2,663,806 | Darlington | Dec. 22, 1953 |
| 2,663,830 | Oliver | Dec. 22, 1953 |
| 2,801,298 | Mital | July 30, 1957 |
| 2,853,632 | Gray | Sept. 23, 1958 |
| 2,887,542 | Blair | May 19, 1959 |

FOREIGN PATENTS

| | | |
|---|---|---|
| 200,400 | Australia | Dec. 7, 1955 |

UNITED STATES PATENT OFFICE

CERTIFICATE OF CORRECTION

Patent No. 2,949,543 August 16, 1960

John G. Nordahl et al.

It is hereby certified that error appears in the printed specification of the above numbered patent requiring correction and that the said Letters Patent should read as corrected below.

Column 1, line 46, for "idealzed" read -- idealized --; column 3, line 45, for "signal" read -- second --; column 9, line 4, for "said means" read -- said bias means --.

Signed and sealed this 31st day of January 1961.

(SEAL)
Attest:
KARL H. AXLINE
Attesting Officer

ROBERT C. WATSON
Commissioner of Patents

Notice of Adverse Decision in Interference

In Interference No. 92,230 involving Patent No. 2,949,543, J. G. Nordahl and W. D. Winter, Electronic amplifier, final decision adverse to the patentees was rendered July 26, 1963, as to claims 3, 6 and 7.

[*Official Gazette November 12, 1963.*]